(12) United States Patent
Böhler et al.

(10) Patent No.: US 10,884,052 B2
(45) Date of Patent: Jan. 5, 2021

(54) TEST SYSTEM FOR CHECKING ELECTRONIC CONNECTIONS

(71) Applicant: Endress+Hauser Flowtec AG, Reinach (CH)

(72) Inventors: Thomas Böhler, Kandern (DE); Matthias Brudermann, Moehlin (CH); Christoph Werle, Liestal (CH); Markus Wucher, Lörrach (DE); Daniel Kollmer, Maulburg (DE); Ludovic Adam, Chalampé (FR)

(73) Assignee: Endress+Hauser Flowtec AG, Reinach (CH)

( * ) Notice: Subject to any disclaimer, the term of this patent is extended or adjusted under 35 U.S.C. 154(b) by 39 days.

(21) Appl. No.: 16/321,984

(22) PCT Filed: Jul. 14, 2017

(86) PCT No.: PCT/EP2017/067814
§ 371 (c)(1),
(2) Date: Apr. 22, 2019

(87) PCT Pub. No.: WO2018/024465
PCT Pub. Date: Feb. 8, 2018

(65) Prior Publication Data
US 2019/0257877 A1    Aug. 22, 2019

(30) Foreign Application Priority Data
Aug. 1, 2016   (DE) .......................... 10 2016 114 146

(51) Int. Cl.
*G01R 31/28* (2006.01)
*H05K 5/00* (2006.01)
*G01R 31/70* (2020.01)

(52) U.S. Cl.
CPC ....... *G01R 31/281* (2013.01); *G01R 31/2808* (2013.01); *G01R 31/70* (2020.01); *H05K 5/0069* (2013.01)

(58) Field of Classification Search
CPC .. G01R 31/281; G01R 31/70; G01R 31/2808; G01R 31/28; H05K 5/0069
(Continued)

(56) References Cited

U.S. PATENT DOCUMENTS 6,617,972 B2 *   9/2003   Takarada   ........... G08B 21/0484
                                                        340/635
6,836,133 B2 *  12/2004   Kinoshita  ............... H01L 22/34
                                                       324/750.3
(Continued)

FOREIGN PATENT DOCUMENTS

DE   102004063488 A1   12/2006
DE   102010053766 A1    6/2012

OTHER PUBLICATIONS

International Search Report for Patent Application No. PCT/EP2017/067814, WIPO, dated Sep. 19, 2017, 13 pp.
(Continued)

*Primary Examiner* — Giovanni Astacio-Oquendo
(74) *Attorney, Agent, or Firm* — Mark A. Logan; Endress+Hauser (USA) Holding Inc.

(57) ABSTRACT

Disclosed is a test system for testing electric connections, in particular soldered connections, between electronic components and a printed circuit board to be tested, characterized in that the test system includes a subassembly, which is movably mounted in a housing of the test system, and a current and/or voltage source for energizing the circuit board to be tested, the current and/or voltage source being arranged in the housing of the test system in such a way as to be movable in at least two directions in space.

12 Claims, 8 Drawing Sheets

(58) Field of Classification Search
USPC .............. 324/207, 230, 629, 633, 763.01
See application file for complete search history.

(56) References Cited

U.S. PATENT DOCUMENTS

| | | | | |
|---|---|---|---|---|
| 6,873,173 B2* | 3/2005 | Kollmer | ............... | G01R 31/275 |
| | | | | 324/750.16 |
| 6,937,047 B2* | 8/2005 | Tran | ................. | G01R 31/2884 |
| | | | | 324/750.3 |
| 7,492,180 B2* | 2/2009 | Forstner | ................ | G01S 7/032 |
| | | | | 324/750.3 |
| 8,779,729 B2* | 7/2014 | Shiraishi | ............... | G06F 1/3212 |
| | | | | 320/155 |
| 2004/0064285 A1 | 4/2004 | Repko et al. | | |
| 2006/0198500 A1* | 9/2006 | Defoort | ................. | H04M 11/06 |
| | | | | 379/1.01 |
| 2010/0259289 A1 | 10/2010 | Haridass et al. | | |
| 2012/0098518 A1* | 4/2012 | Unagami | ............. | G01R 22/066 |
| | | | | 324/74 |
| 2014/0062521 A1 | 3/2014 | Yamada | | |
| 2014/0263613 A1 | 9/2014 | Roisen et al. | | |
| 2015/0168452 A1 | 6/2015 | Chang | | |

OTHER PUBLICATIONS

Search Report for German Patent Application No. 10 2016 114 146.1, German Patent Office, dated Apr. 28, 2017, 7 pp.

* cited by examiner

TEST SYSTEM FOR CHECKING ELECTRONIC CONNECTIONS

CROSS-REFERENCE TO RELATED APPLICATIONS

The present application is related to and claims the priority benefit of German Patent Application No. 10 2016 114 146.1, filed on Aug. 1, 2016 and International Patent Application No. PCT/EP2017/067814 filed on Jul. 14, 2017, the entire contents of which are incorporated herein by reference.

TECHNICAL FIELD

The present invention relates to a test system according to the preamble of claim 1.

BACKGROUND

EP 0 633 478 A2 discloses a test system for checking electronic connections of electronic assemblies, including a circuit board to be tested.

Such test systems have been further developed successively. Thus, the electrodes are guidable by articulations and/or robot arms to the circuit board and ascertain, e.g., by resistance measurement, whether a solder connection is correctly positioned and whether an electrical connection of the electronic assemblies of the circuit board can occur via said solder connection.

The electrical contact is tested by resistance measurement. Excessive heat development on the surface of the circuit board may occur due to mispositioning due to faulty equipment or other reasons.

Current testing systems using resistance measurement provide no verification of such heat buildup.

SUMMARY

Based on prior art, it is now an object of the present invention of a generic test system in a compact design to expand other functions.

The present invention solves this problem by a test system having the features of claim 1.

A test system according to the invention for checking electronic connections, in particular soldered connections, between electronic assemblies with a circuit board to be checked or tested, can advantageously be performed by resistance measurement. In addition, the test system has a temperature measurement device for measuring the temperature of electrical connections and/or for determining characteristic thermal values of electrical connections, e.g., of solder joints, of a circuit board or components on a circuit board. By means of this temperature measurement, a redundancy check of the electrical connection of the components to the circuit board can take place in one test in a time-efficient manner and in a space-saving configuration, and the components can be checked.

Thus, a test system can perform several checks simultaneously, generating savings in both time and space. In addition, it is possible to detect and correct several defects at once on the circuit board to be tested.

Advantageous embodiments of the invention are the subject matter of the subclaims.

The temperature measuring device is advantageously arranged movably in at least two spatial directions, preferably in three spatial directions, within a housing of the test system. As a result, the circuit board to be tested can be analyzed area by area with the temperature-measuring device, which allows a more accurate determination.

It is advantageous for a time-efficient measurement with little risk of damage to the circuit board to be tested and the test system, if the temperature-measuring device performs a non-contact measurement of the temperature.

Particularly preferably, the temperature measurement can be carried out by a thermography system, in particular by an infrared camera.

The test system can also have a communication interface with at least three electrically-conductive contact tips, which enable a data exchange with the data memory of the circuit board to be tested by making contact with a contact arrangement on the circuit board with several, especially metallic, contact positions or areas, wherein the data exchange happens according to a communication protocol.

A differential data feed can advantageously take place to the circuit board to be tested via at least two of the contact tips, and via at least two further contact tips, a differential data return can take place to the circuit board.

The communication interface and the temperature measurement device can be permanently connected to a test module, for example, a circuit board of the test module, wherein the test module is movably arranged in at least two spatial directions in the housing of the test system. In addition, the temperature measurement device may advantageously be arranged to be movable in at least one spatial direction relative to the test module, so that the temperature measurement device, e.g., for a particularly accurate measurement, can be moved from the test module to be tested on the circuit board.

The test system can advantageously have a data memory on which data sets are stored with regard to at least one permissible temperature scale of individual components and/or subregions of a circuit board for comparison with the determined temperature and/or heat values of the components of the circuit board.

It is advantageous if the test board has a sensor device, in particular a camera or a barcode scanner, for recognizing an identification feature of the circuit board to be tested, in particular a barcode, serial number or QR code, wherein the test system uses the identification feature to retrieve a permissible temperature profile for this board type.

Furthermore, the test system can have a current and/or voltage source, and optionally also with control characteristics, for supplying energy to the temperature measurement device, wherein the current and/or voltage source is firmly connected to the temperature measurement device and movably arranged in at least two spatial directions within the housing of the test system.

The test system, in particular the test board, may have at least one tool component for repairing electrical connections on or at the circuit board, the tool component being controlled on the basis of measured values determined by means of a temperature measurement device. Thus, a detected defect can be corrected directly in situ.

The test module may have a transformer module with a transformer, with which a galvanic isolation to the communication module on the circuit board to be tested is realized and which ensures an adaptation in the sense of an Ethernet connection, in particular regardless of whether or not there is another electrical connection to an Ethernet socket with the communication module.

BRIEF DESCRIPTION OF THE DRAWINGS

The invention will be explained in more detail with reference to several embodiments and with the aid of the accompanying figures. In the figures.

In principle, test systems for testing electronic circuit boards are known. They serve to test the functioning of individual electronic components, which are arranged on the circuit board and soldered to it. Furthermore, a corresponding test system serves to test the electrical connections between the electronic components or of the electronic components with each other and with the conductor tracks of the circuit board.

Figure 1:
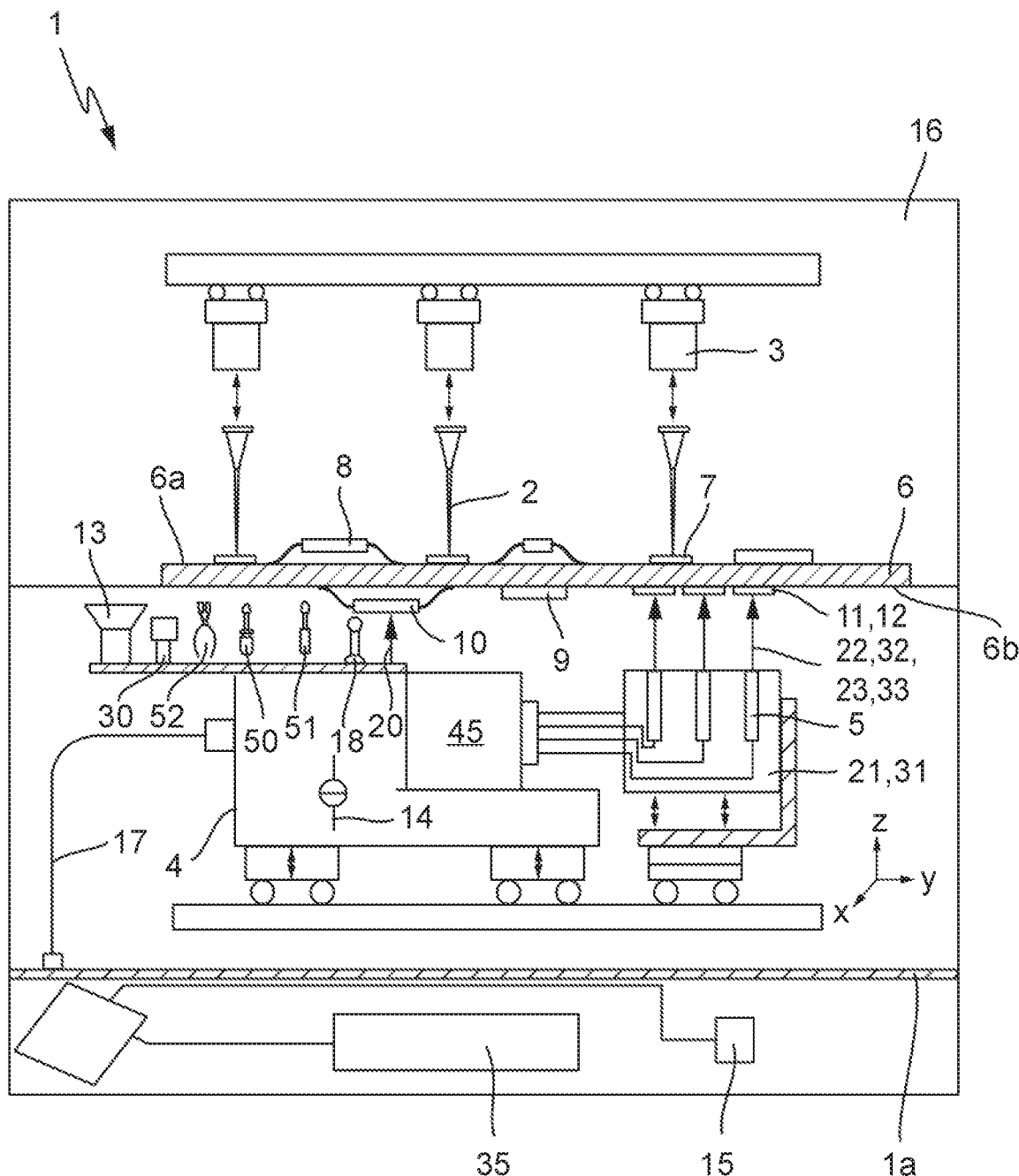
FIG. 1 is a schematic representation of an axially driven test system according to the invention for testing electronic circuit boards.

FIG. 1 shows a test system 1 according to the invention for testing electronic circuit boards, wherein a respective circuit board 6 to be tested has a number of integrated circuits 8 on the upper side 6a of the circuit board 6.

At least a pin-shaped test tip 2, preferably several pin-shaped test tips 2, are introduced by the test system 1 above the circuit board to be tested. These test tips may preferably be formed as electrodes. The leading of the test tip or test tips can be effected, for example, by robot arms 3 which are located above the circuit board to be tested 6, which are freely movable in the x-, y- and z-plane, e.g., by movable telescopic arms or by x, y, and z linear motorized articulated arms, to or away from contact points 7 of the circuit board. Resistance values can be determined at these contact points 7.

The robot arms 3 can, for example, be embodied as a linearly guided carriage, which has one or more joints, so that the pin-shaped test tips 2 are guidable to the circuit board from above or along a plurality of axes.

Arranged beneath the circuit board 6 to be tested is a test module 4, which is part of the test system 1 and is movable toward an underside 6b of the circuit board 6. Test module 4 is, thus, arranged analogously movable in the x-, y-, and z-directions relative to the circuit board 6. This is enabled, e.g., in the x- and y-directions by linear guiding, e.g., by linearly guided slide tracks, thus e.g., so-called linear tables. This can occur especially by a roller-, chain- or cable pull guiding. Thus x- and y-linear guide is then movable in the z-direction, which is perpendicularly to the plane of the circuit board 6, by a robot arm or other linear guide.

As an alternative to this, the circuit board 6 can also be arranged movably relative to the test module 4 and/or the pin-shaped test tips 2. In this case, the test system 1 includes a holder movable at least in the x- and y-directions, and optionally, also in the z-direction, e.g., by a height adjustable, linear table.

Test module 4 can, thus, be brought towards the circuit board 6 from below. Differently from the case of the individual test needles guided from above for testing the electrical integration of the electronic components with the circuit board 6, the test module performs a test of the functional test, e.g., the data transmission of a communication module 9 of the circuit board 6.

Test module 4 includes a communication interface 5 for communication with the communication module 9 of the circuit board 6 to be tested. By means of the communication interface 5, the test system 1 can be used to program a data memory 10 arranged on the circuit board 6 to be tested. In this way, the test system can furnish data to the data memory, for example, data in the form of a serial number, an IP/MAC-address, as well as comparative values and/or data sets predetermined in the plant. Two preferred variants for the communication interface 5 are shown in FIGS. 4 and 5.

Figure 4:
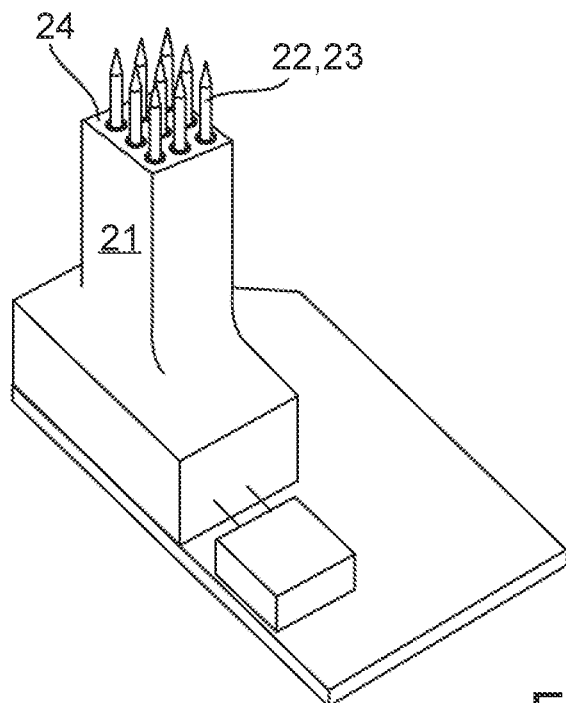
FIG. 4 is a schematic representation of a first variant of a communication interface as part of the test system according to the invention.
Figure 5:
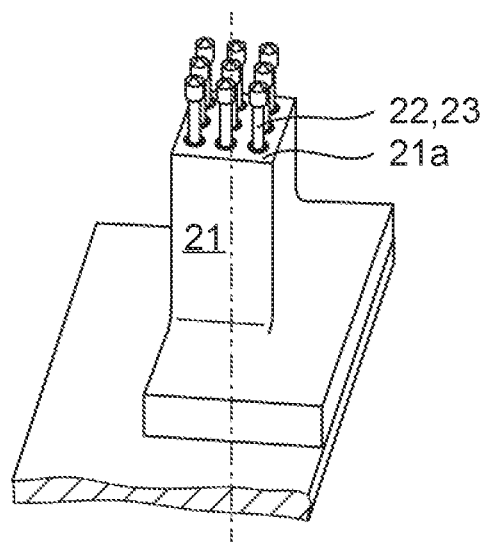
FIG. 5 is a schematic representation of a second variant of a communication interface as part of the test system according to the invention.

The communication interface 5 includes in FIG. 4 preferably a housing section 21 and a number of contact tips 22, which protrude in the form of an array arrangement 23 from an end face 24 of the housing section 21. The contact tips 22 of the array arrangement 23 are arranged in a rectangular arrangement with a total of nine contact tips. The housing section 21 sits on a circuit board, which can be test module 4 or a circuit board set apart from test module 4 but connected via data links as well as energy supply lines and preferably also via a fixed mechanical connection with test module 4.

In this way, energy supply and data linking of the communication interface in a preferred variant of the invention occurs directly via the test module 4 and the components arranged thereon or connected therewith, so that long data transmission paths are avoided and signal quality, in the case of data transmission as well as transmission speed, can be increased.

The array arrangement 23 serves for contacting the communication module 9 on the circuit board to be tested. In this case, the circuit board 6 has metallic contacting regions 11. The contacting regions 11 are pointed or rectangular segments, which are spaced from one another and have the same arrangement as the contact tips 22 of the array arrangement 23.

The contact tips 22 are spring-mounted in the housing section, so that they retract to a part in the housing section 21 when contacting with the contacting regions 11 of the circuit board 6. Thus, because of the flexibility or the ability of the contact tips 22 to move in and out of the housing section, bending of the contact tips 22 and damage to the contacting regions 11 of the circuit board 6 can be prevented. The contact tips 22 can be held via at least one securing element in a retracted position, in which a spring, with which the spring-mounted contact tip 22 interacts, is compressed and thus tensioned. Thus, it is possible to change the array arrangement, i.e., the number of fully extended contact tips, and thus to adapt to the number of contacting regions 11 of the circuit board. If more contact tips 22 are available as corresponding contacting regions 11, then rigidly-projecting, i.e., non-resiliently seated contact tips would rest on an unprotected surface of the circuit board, whereby damage could occur to the contact tips 22 and could scratch the circuit board. This is advantageously prevented by the ability of the individual contact tips 22 to extend or retract from or into the housing section 21.

Figure 2:
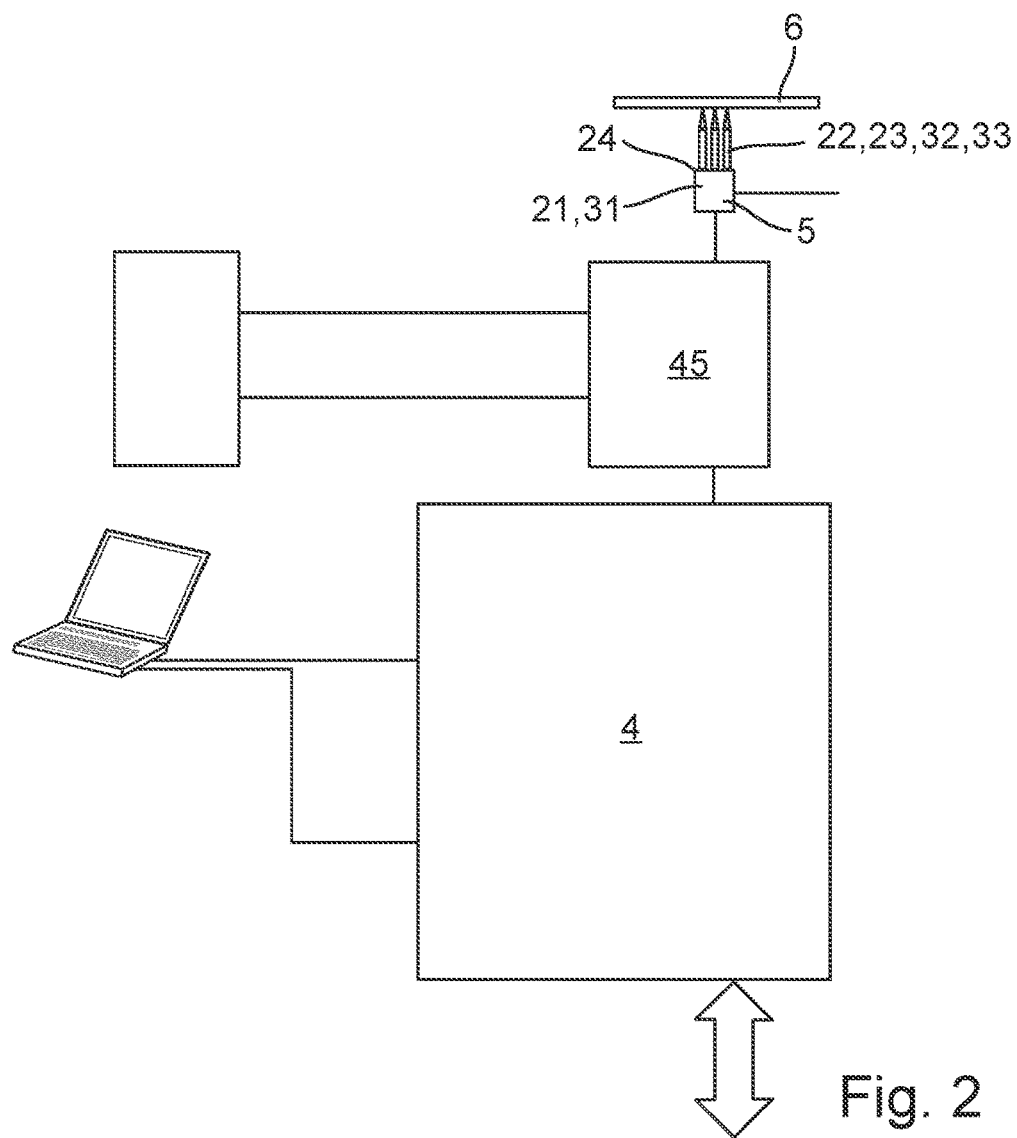
FIG. 2 is a schematic representation of a test module as part of the test system according to the invention.

FIG. 2 schematically shows an aforementioned test module 4 connected with the communication interface 5. This test module 4 is preferably applied for communication by the test system 1, for example, in connection with a computer, for testing circuit board 6. Additionally, it can, however, also be useful to tap measurement data from the circuit board to be tested via the communication module 5 and to forward such to the measuring electronics of the test system. This is performed via switching contacts on the test module 4.

These switching contacts enable use of the test module 4 for communication, for forwarding measurement data or for a mixed operation.

Via the transformer module 45, which, among other things, also has switching contacts, yet more data sources can be connected directly with the circuit board 6 to be tested via the communication module 5. Control signals, which preferably come from the test system 1, control, for example, the switching of relays in the transformer module 45.

Figure 6A:
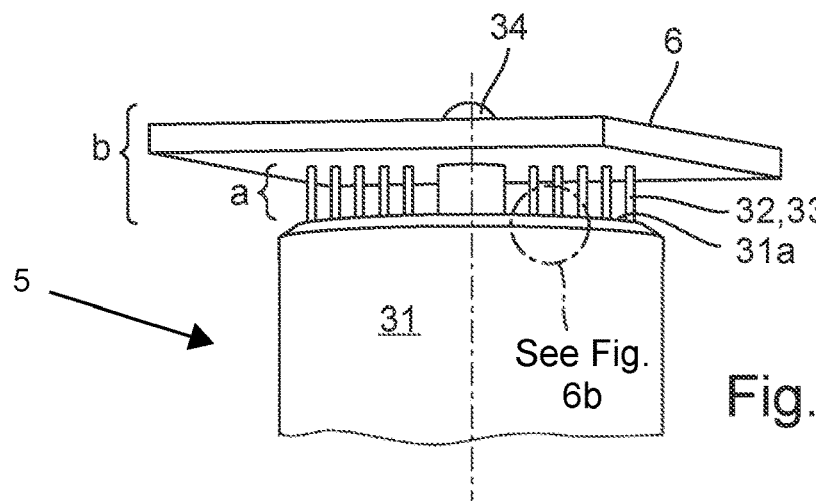
FIG. 6a is a schematic representation of a contacting arrangement of a circuit board for data exchange with a communication interface of a test system.

The communication interface 5 of FIG. 6a preferably also has a housing section 31 and several contact tips 32 in an array arrangement 33. In the center, a plug 34 is arranged, which is spring-mounted and which, on contact with the circuit board, retracts into the housing section 31 by a predetermined distance. This prevents damage to the circuit board 6 or damage to the contact tips when contacting the array arrangement 33 on the circuit board 6.

An array arrangement 23 or 33 within the scope of the invention is an arrangement of a number of contact tips 22 or 32, which contact a circuit board 6 with fixed and defined separations relative to one another and perform a data exchange at contact points.

In the simplest case, three contact tips are used for this. This already enables data transmission using the so-called SPI bus system (Serial Peripheral Interface). For this, a first contact tip 22 or 32 is required for data supply, a second contact tip 22 or 32 for data return and a third contact tip 22 or 32 for a reference potential.

Additional functionalities can be added by adding further contact tips. Thus, another reference potential can be tapped. Also, a galvanic isolation may be provided. The circuit board can be powered with one or more voltages. Furthermore, one or more simulations can be performed, e.g., by sending a control command using a contact tip 22 or 32. Furthermore, a measured value check of a component of the circuit board 6 by a contact tip 22 or 32 in response to the transmitted control command. Another contact tip 22 or 32 can serve as an indication line for testing the operational readiness of the components of the circuit board 6.

By means of the communication interface 5 contacting with the contacting regions 11 of the circuit board 6, testing the Ethernet connection of the circuit board into the communication module for the Ethernet connection is allowed.

Especially preferable is that the number of contact tips 22 or 32 per array arrangement 23 or 33 is nine or ten.

The variants of a communication interface described above have the particular advantage that they can be positioned directly by the test module 4 and, starting from the test module 4, have short signal and power supply lines to the communication interface 5. This prevents data loss due to long transmission paths and also achieves exact signal generation and signal reception by the communication interface 5.

The contacting regions 11 represent the counterpart to the array arrangement 22 or 32 of the communication interface 5. The contacting regions 11 may have different shapes, e.g., round or rectangular. They are an uninterrupted metal surface. A plurality of contacting regions 11, e.g., nine contacting regions 11, form a contacting arrangement 12. The contacting regions of the contacting arrangement 12 are spaced apart in the shape of a pattern. These spacings of a contacting region 11 from each neighboring contacting region are preferably always arranged in the same way. The contacting regions are free of other components and/or solder resist or other coatings that might interfere with the data connection.

The contacting regions 11 of the contacting arrangement 12 of the circuit board 6 are preferably arranged in a circular pattern, preferably in at least two or more circular paths or likewise preferably in a rectangular or square pattern, on the circuit board 6.

Figure 7:
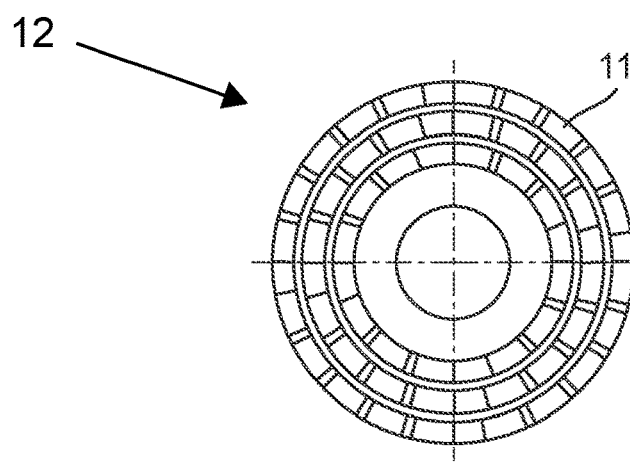
FIG. 7 is a schematic representation of a second contacting arrangement on a circuit board for data exchange with a communication interface of a test system.
Figure 8A:
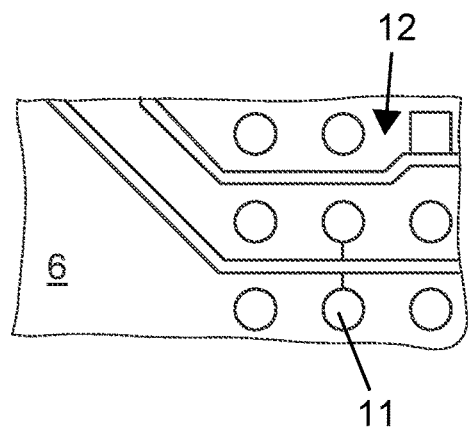
FIG. 8 is a schematic bottom view of the second variant of a communication interface of the test system according to the invention, according to FIG. 5.
Figure 8B:
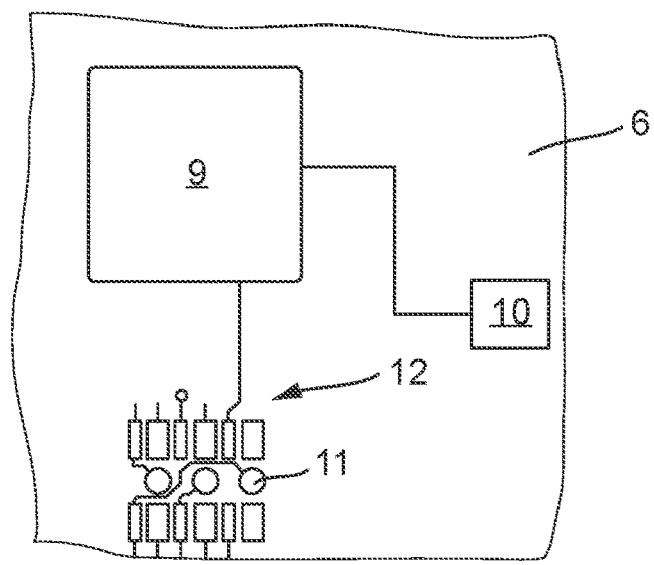

Corresponding patterns are shown in FIGS. 8a and 7.

Figure 6B:
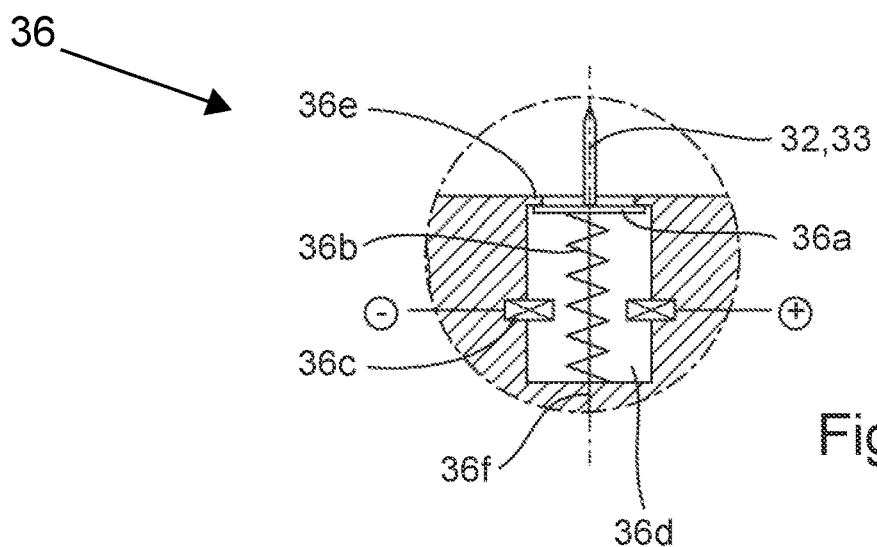
FIG. 6b is a schematic representation of a holding apparatus for extending and retracting contact tips of the communication interface.

In FIG. 6b, a holding apparatus 36 of a contact tip is shown in detail. This makes it possible to extend and retract contact tips from the housing of the communication interface. The holding apparatus shown in FIG. 6b is only one of several variants for holding a contact tip in a retracted position in the housing. In this case, the contact tip 32 comprises a plate-shaped formation 36a. This is movably mounted in a channel 36d. A spring 36b presses against the formation 36a whose movement is limited by a stop 36e, which protrudes into the channel. For holding in the retracted position, an electromagnet 36c is provided, which attracts the plate of the contact tip upon activation of the electromagnet. If the electromagnet 36c is not activated, the contact tip is exclusively spring mounted. Extending from the contact tip is a cable 36f, which serves for signal and/or energy transmission. The holding apparatus is not limited to FIG. 6a but can also be used for all other variants of the above-described communication interfaces.

The contacting regions 11 are preferably gold plated or tinned.

A corresponding contacting arrangement 12 is preferably arranged in the vicinity of the communication module 9 of the circuit board 6 on the communication path, so that the communication of the individual components of the circuit boards and a loading of data e.g., on the data memory of the circuit board, bypassing the communication module 9, so e.g., the Ethernet socket, can occur.

A circuit board 6 to be tested having a communication module, which is designed as an Ethernet interface, can in the case of a test in a manner not of the invention, be contacted by any test system via a standard Ethernet socket with a communication interface of the test system.

In the context of the present invention, however, it is proposed that such a test takes place automatically, wherein the plug connection via an Ethernet standard socket has proven to be expensive for this purpose. An automated testing of such an Ethernet interface has not been offered by established companies, which develop automated test systems, e.g., for testing solder contacts.

The communication interface 5 may preferably have one or more components, which are modeled on the components of the communication module 9 of the circuit board 6. This component is arranged in the housing section 21 or 31 in FIGS. 4 and 5 and can be designed, for example, as a transformer module 45, also called a converter. Such a transformer module can preferably be a so-called Ethernet Magnetic Transformer. A corresponding transformer module is usually also integrated in an Ethernet plug, which, however, can be bypassed by contacting the communication interface 5 with contact areas 11 of a contacting arrangement 12 on the circuit board 6.

Thus, the communication module can be connected with the circuit board 6 and exchange data with the components via the array arrangement 23, 33 without large signal loss before and after transforming due to long data links.

By the functionally identical replication of the components of the communication module 9 of the circuit board through the components of the communication interface 5 of the test module 4 secure communication with the processor unit, the data memory and other components on the circuit board to be tested 6 can be ensured without it depending on whether the bridged Ethernet socket of the circuit board 6 has no transformer module, a transformer module or multiple transformer modules connected in series or in parallel to each other.

After read-out the type of Ethernet socket on the circuit board by the test system, e.g., based on a barcode on the circuit board, the test system can select a corresponding component circuit which corresponds to the interconnection of the Ethernet socket so that an identical data exchange between the test system 1 and the circuit board 6 is enabled despite bridging, as if the test system was connected thereto via the Ethernet Socket of the circuit board 6.

Thus, for example, a data exchange can occur at a typical data transmission rate of 10 to 100 Mbit/s.

Figure 8C:
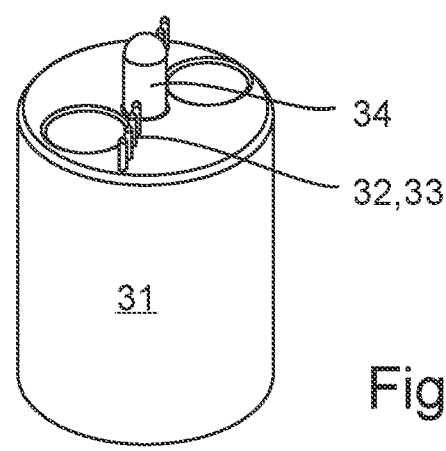

In FIG. 6a and FIG. 8c, a variant of an array arrangement 33 is arranged with a plug 34. In this variant, the plug is formed as a centering plug and the contact tips 32 are arranged spaced from each other along a radial line extending to this centering.

The contact tips 32 may be extendable and extended, for example, by means of a locating mechanism when required. Thus, depending on component type of the circuit board, the none-required contact tips 32 can be retracted.

The type of component can be identified by means of a barcode located on the circuit board, which can be identified by means of a camera 13 located on the test module 4. Depending on the information in the barcode, then the communication interface 5 and associated components, as well as other components of the test module 4, can be correspondingly operated and, especially, placed in readiness.

The retractable contact tips require less space on the circuit board to be tested for contact areas 11, so that the material of the circuit board can be saved, and an optimized component arrangement can be achieved on the circuit board.

The centering by the centering plug can especially work together with an arrangement of contact areas 11 on a circuit board 6 as shown in FIG. 8c.

Furthermore, it is, in such case, advantageous that the array arrangement, i.e., the arrangement of the pin-shaped metal contact tips 22, 32, is arranged in a rotatable fashion around an axis defined by the centering plug. Thus, the pin-like contact tips better approach the contact areas 11 and make contact with them, so the number of contact areas 11 can be reduced advantageously. The ability to rotate of the array arrangement is also advantageous in the case of rectangular array arrangements of the contact tips, such as that shown e.g. in FIG. 4.

Figure 12:
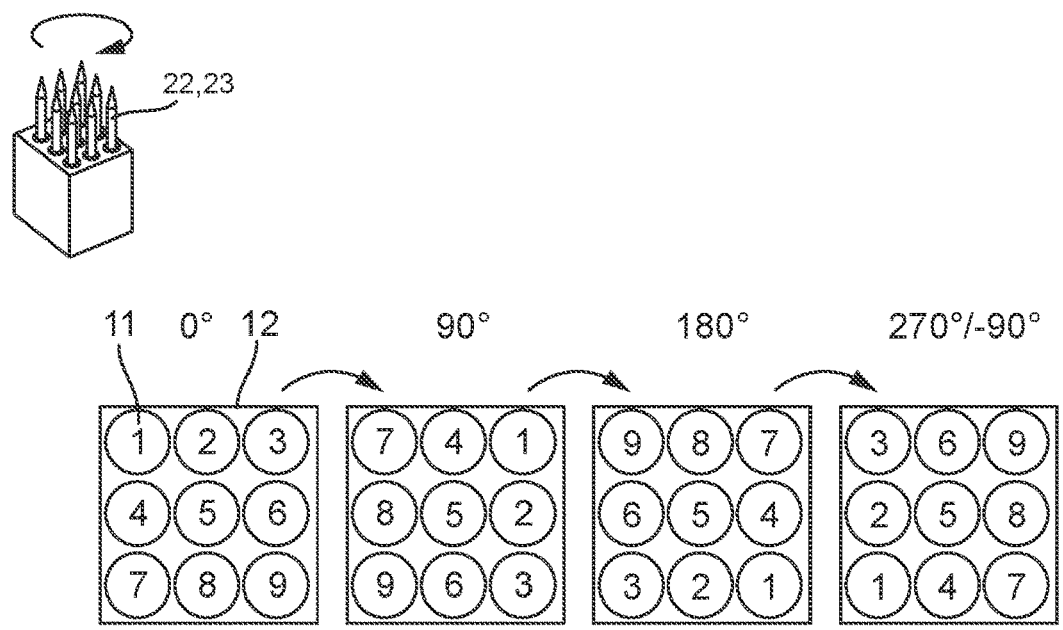
FIG. 12 is a schematic representation of a rotating communication interface.

The ability to rotate of the array arrangement 23, 33 as shown in FIG. 12 and FIG. 8c is, additionally, advantageous since, in this way, circuit boards 6 can be supplied with different orientations, thus, delivery in longitudinal or transverse direction of the circuit board, and tested in the test system 1, without requiring that the circuit board first must be brought into position by rotation. Rather, by rotation of the array arrangement 23, 33, its tips 22, 32 can be oriented according to the orientation of the circuit board. Turning the circuit board or feeding it into the test system from a non-optimal direction, therefore, has no consequence for testing or data transfer.

The rotation of the array arrangement, e.g., by rotatable seating of the array arrangement, can thus be implemented advantageously in the case of the present invention for a rectangular array arrangement of the contact tips as well as for a linear arrangement of the contact tips.

Figure 13:
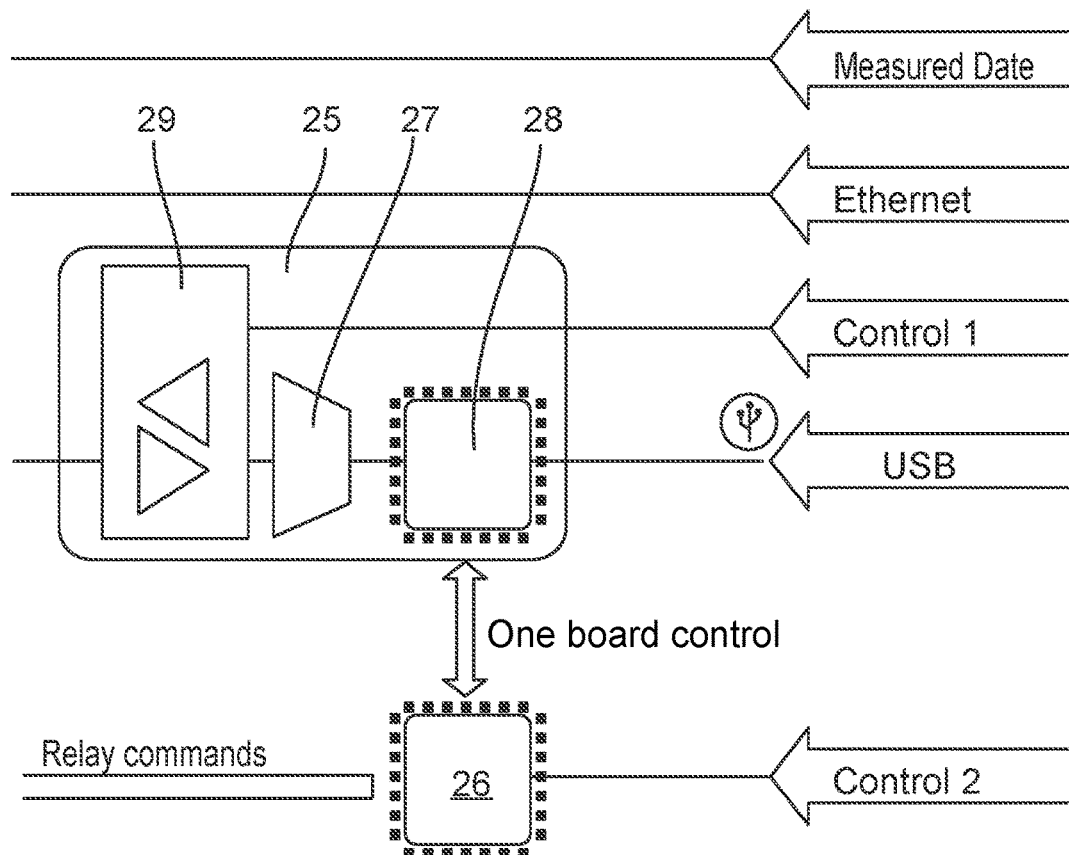
FIG. 13 is a schematic representation of an implementation with different communication protocols.

By furnishing various data sets, the test module 4 can communicate via different communication protocols with the circuit board 6 to be tested and the thereon located communication modules 9 and data memory 10, as shown in FIG. 13. Thus, depending on type of communication, an individualized supply of communication protocols can occur, and, in certain cases, there can be a switching between types of communication. For this, no additional systems are enabled but rather the data transmission can occur during the testing of the solder locations and electronic components.

As a result, different communication protocols can be applied to the circuit board 6 to be tested by the test system as required, and/or the circuit board 6 can be checked for the presence of these communication protocols. Such communication protocols are e.g., I2C, SPI, USB, Ethernet, Profibus and/or UART.

The levels of the drivers are preferably adjustable via software stored in the data memory or a logic chip of the test module 4 or directly via the test system 1. Thus, the test module 4 can not only communicate with different communication protocols via the communication interface 5 but also can adapt the voltage level of the communication signals to the level of the circuit board 6 to be tested.

Furthermore, a self-diagnosis program is stored on the data memory or the logic chip of the test module 4, with which a diagnosis of the test module 4 and the communication interface 5 can occur and which can be executed by a processor or a logic chip of the test module 4.

In the context of the present invention, the communication interface 5 is referred to as a first component for functional testing with which, by transmitting and receiving communication data to and from the circuit board 6, the correct data transmission of the circuit board 6 is tested by test system 1, especially by a processor unit associated with the circuit board 6, which manages a data memory. Other components, which preferably can be applied in the case of the present invention, will be described below.

The test module 4 includes at least one or more extra components in the context of the present invention, which serve as a support element 18 for spacing between the circuit board 6 and the test module 4 and, if required, to support the circuit board 6 against sagging.

A third component, which may be arranged on the test module 4, is a camera 13 for image acquisition in the visible spectral range. This camera 19 can fulfill various functions.

It can be used to determine the position of the circuit board 6 to be tested.

It may alternatively or additionally also examine the circuit board 6 to be tested for the presence of components with which the circuit board should be equipped.

Camera 13 may also alternatively or additionally detect a barcode or a serial number on the circuit board 6 and retrieve and initiate the specific data sets of the circuit board according to this barcode, and retrieve and initiate control programs from a data memory. Among other things, this may include special specifications for examining the circuit board 6, or the components arranged thereon, or the extent of the data which is to be transmitted to the data memory of the circuit board 6 with the aid of the communication interface.

Camera 13 can, additionally, check for the presence of solder locations.

Additional functions, such as further diagnostic functions, can additionally be performed by the camera.

A fourth component of the test module 4 may include, for example, a metallic pin-shaped test tip 20, e.g., for testing the solder contacts on the bottom side by resistance measurement, but which, unlike the test tips 2 that are brought from above to the circuit board 6, may be arranged rigidly with the test module 4 or only in one movable direction, in particular extendable, on the test module 4. This reduces the mechanical complexity of this metallic test tip 20.

As an alternative or in addition to mechanical functions or diagnostic functions by means of the aforementioned component or components, it is also possible to load data exclusively, e.g., of communication protocols through the communication interface 5. By loading the data onto the data memory 10 of the circuit board 6 to be tested simultaneously during testing of the solder joints, e.g., through the test probes 2, time is saved is during quality control.

The loading of data can be done, for example, as a type of basis or basic programming. The circuit board 6 to be tested can be used in particular in a measuring device of automation technology. Data can be transferred to the data memory 10 depending on the respective measuring device, the field of application of the measuring device and the production line during the production of the measuring device. The data transmission can be done specifically from the assembly of the circuit board so that data for control, test, and/or identification of the individual components or assemblies of the circuit board 6 can be transferred from the data memory of the test module 4 via the communication interface 5 and the communication module 9 to the data memory 10 of the circuit board.

Alternatively, or additionally to the aforementioned components, the test module 4 can also comprise one or more tool components 50, for example, a soldering element 51 for forming a soldered connection or pliers 52. Other tool components e.g., screwdrivers and the like may also be provided. By controlling the tools, the circuit board 6 to be tested can be repaired soon after the detection of a defect by the upper test tips 2 or the removal of placement aids can take place.

Additionally, the test module 4 can also have a current and/or voltage source for supplying power to the tool components or the components for functional testing.

The test system 1 has the data memory 35 with a corresponding test program stored therein. This test program controls the use of the support element 18, the contact tips 22, the test tip 20, and/or, if required, further tools 50, 51, 52 and their positioning. As a result, different circuit boards 6 to be tested with different distances between the components can be tested and supplied with data.

In addition to the solder location tests performed on the top by the test tips 2 in a variant of the present invention, the test module 4 performs functional testing of individual components.

The aforementioned components of test board 4 may be arranged individually or, preferably, together on the test module 4. The latter is an advantage, as a specified distance is maintained.

Due to the mobility of test module 4 below the circuit board 6 in the x-, y-, and z-direction simultaneously with the quality control of the connections of the electronic components with the lines of the circuit board, a functional test of the respective components of the circuit board to be tested can also be carried out; this leads to saving time and space, since no additional test system is needed.

A further aspect of the present invention is the voltage and/or electrical current supply of test module 4 and the components connected therewith, thus, the communication interface 5, as well as the circuit board 6 to be tested, however, also other components, e.g. tool components, such as pliers or solder elements or one or more cameras. In previously known test systems, the voltage is supplied by a current and/or voltage source outside the test system, i.e., spatially removed from the test specimen or the circuit board 6 to be tested.

According to the concept of the present invention, the current and/or voltage source 14 is part of the test system 1 and in particular part of test module 4. As a result, a voltage drop due to long lines 17 is prevented. The current and/or voltage source may be controlled by a control unit 15 according to a program or by manual input from the control unit 15.

The test system 1 itself is bounded by a housing 16. While test module 4, communication interface 5, and the current and/or voltage source 14 are movably arranged in the housing, the control unit 15 is preferably arranged rigidly in, on, or outside the housing 16 of the test system 1.

In a particular embodiment of the invention, the contact tips 22, 32 are connected directly to the current and/or voltage source 14 via a power supply line. The current and/or voltage source 14 can be supplied with energy from the outside, i.e., outside the housing 16 of the test system 1 and can also be set externally with control commands to a voltage output value.

Using control unit 15, test module 4 and in particular the supplied voltage to the communication interface 5 or to the test module 4 and in particular the supplied current to communication interface 5 can be set or both the supplied current and the supplied voltage can be set. Thus, in particular, the contact tips 22, 32 can be operated with an electrical current having a predetermined voltage and/or a predetermined electrical current level.

A current and/or voltage source 14 in the context of the present invention is a component that generates a discrete smaller voltage and/or current from a larger voltage or a larger current regardless of the level of the supplied voltage or current.

To test which voltage arrives at the contact tips 22 or 32, the current and/or voltage source 14 can preferably be connected to the contact tips via a read-back line, a so-called sense line. In the present current and/or voltage source 15, the output voltage or a part thereof is compared with a reference voltage and regulated so that even with fluctuating load, the output voltage on the circuit board to be tested 6 remains constant. However, this condition usually only exists in ideal conditions. Therefore, the voltage to be compared with the reference voltage in the vicinity of the load, that is, at the contact tips 22 or 32 thus behind the lines with the fluctuating voltage drop, is determined by way of the read-back line. The voltage drop on the supply lines is thereby compensated and the voltage at the load, i.e., the contact tips of the communication interface 5, remains constant even in the real case. The aforementioned line can be connected in parallel with the voltage input of each contact tip so that the electrical current and/or voltage source 14 can compensate for the voltage drop of the line resistance. The voltage generated by the current and/or voltage source 14 can thus be adjusted after comparison with the read-back values. Thus, the voltage drop through the conduction path between the contact tips 22, 32 and the current and/or voltage source 14 can be compensated and, if necessary, voltage fluctuations can also be compensated.

Overall, the power supply from the current and/or voltage source can be controlled by a program, which is preferably stored on the data memory of test module 4. A preferred type of programmable voltage source is also known as LDO (low-drop-out voltage regulator) and can be used in the context of the present invention as a preferred form of a current and/or voltage source 14.

The current and/or voltage source 14 is designed so that it can react and compensate extremely quickly for changes in load on the circuit board to be tested, preferably in the range of a few nanoseconds. This is preferably required if the circuit board 6 to be tested is a component with fast microprocessors with fast communication and memory components that have dynamic load changes.

This function is preferably achieved by way of chips with fast control properties and/or with capacitors that can bridge very short energy peaks.

In a further preferred variant of the invention, the current intensity can also be read out and limited by reconciliation with a stored data set. This data set can also preferably be stored on the data memory of test module 4 and/or of control unit 15.

Figure 10:
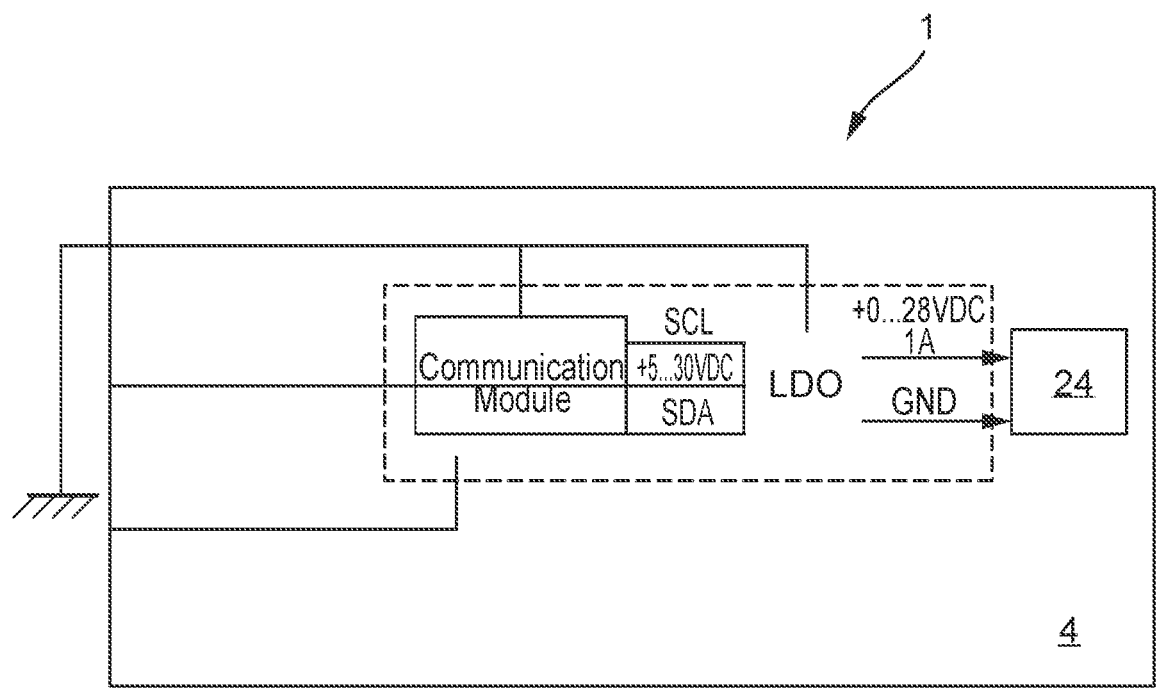
FIG. 10 is a schematic representation of a circuit diagram of an LDO voltage source with the test module.
Figure 11:
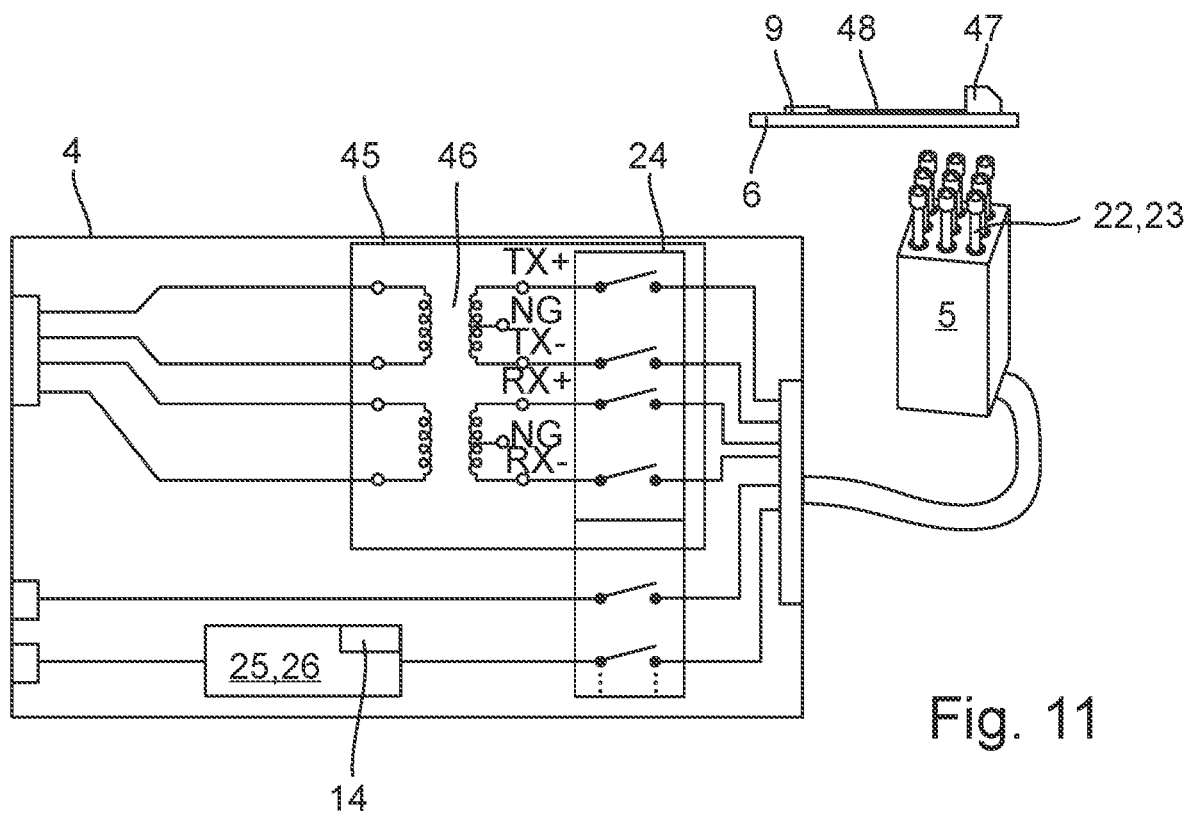
FIG. 11 is a schematic representation of a transformer module for Ethernet communication.

A circuit diagram for a preferred current and/or voltage source 14 is shown in the diagram of FIG. 10. It shows: The LDO shown in FIG. 10 is a so-called low drop out voltage regulator. The communication module is a communication module that controls the LDO and represents the connection to the test system 1. The LDO may be located on the test module 4 or the communication interface 5. The illustration in FIG. 10 shows positioning on the test module 4.

Figure 9:
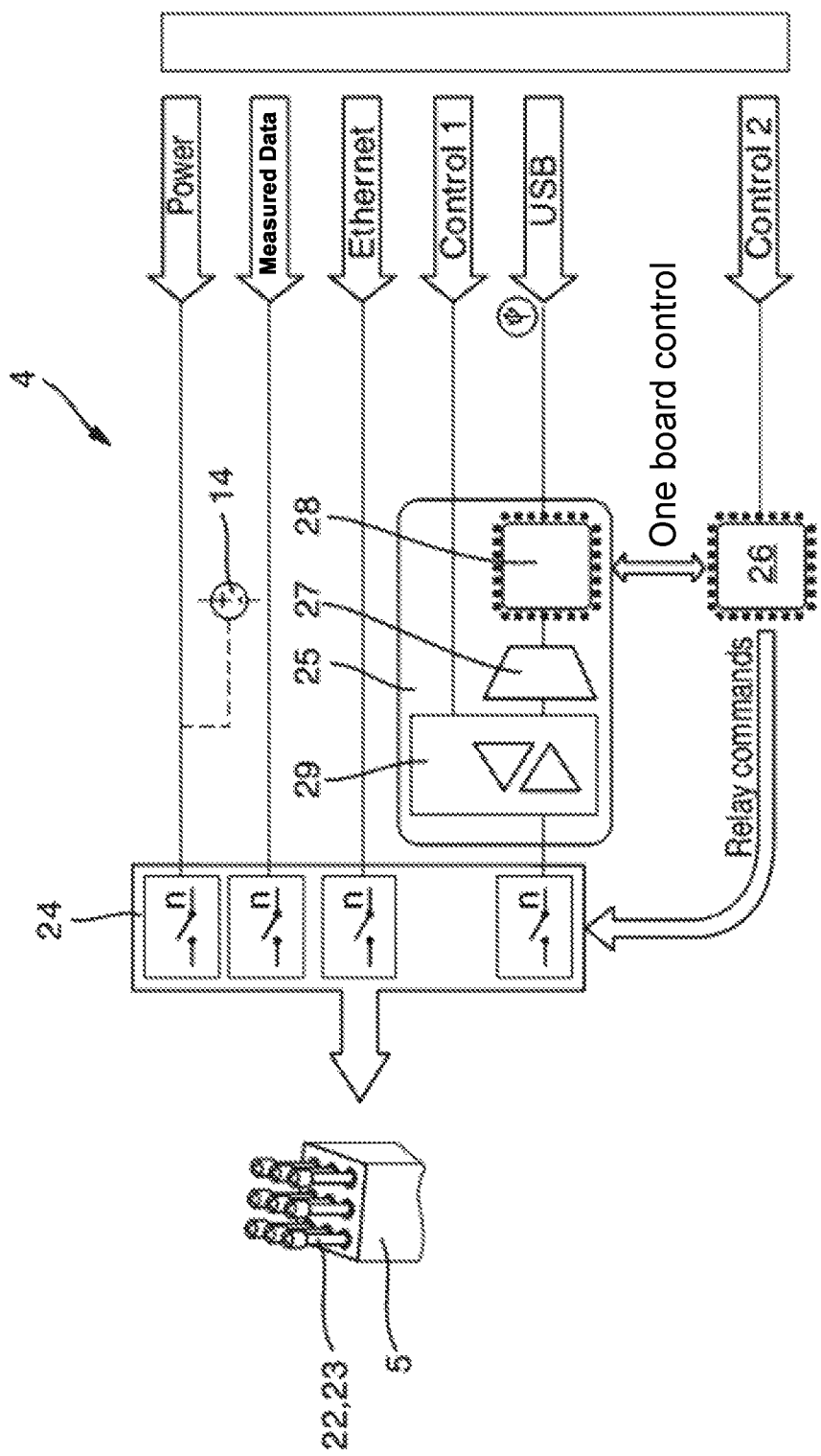
FIG. 9 is a circuit diagram of an arrangement of several components of a test module with communication interface of the test system according to the invention.

FIG. 9 shows the essential components of communication module 4. The core forms the communication unit 25. It represents the various communication protocols and/or converts a protocol coming from the test system, e.g., USB into another protocol. A multiplexer 27 (MUX), which is connected downstream of the communication chip 28, can switch the individual communication signals to any contact tips 2, 32 of the communication interface 5. This, in turn, brings flexibility in the design of the contact points 7 and the array 23 on the circuit board to be tested 6. The multiplexer 27 (MUX) may be followed by a driver/sensor 29, which can adjust the signal levels of the communication signals. Thus, the flexibility of communication unit 25 is increased because it can adapt to different signal levels and thus to different voltage technologies of the circuit board 6 to be tested. Furthermore, the driver/sensor 29 may also include a sensor that measures the current on the communication lines and in case of deviations, e.g., triggers an error message or performs a shutdown. The control of the communication chip 28, the multiplexer 27, the driver/sensor 29, and the downstream relay matrix 24 is represented by a logic chip 26 which, in turn, is connected with the test system. The logic device 26 can be performed by an FPGA, a microcomputer or another chip with logic functions. An additional relay matrix 24 extends the flexibility of the test module 4 in that it offers the option of switching several signal sources, power supplies, communication interfaces, and measurement data as well as the interface signals from the communication unit 25 to any contact tip 2, 32 of the communication interface 5. This also applies to the current/voltage source 14 of the test module 4 and to supply units of the test system 1 as connected to the test module 4. In this case, a mixed or combinatorial interconnection is conceivable. Relay matrix 24 can also be controlled from the control unit 26.

The transformer module 45 is preferably part of the test module 4 and can be connected via the communication interface 5 to a circuit board 6 to be tested. The circuit board to be tested contains a communication module 9, which preferably supports Ethernet or Profinet communication. Magnetics 46, i.e., transmitter or transformer, of the transformer module 45 are dimensioned such that it implements a galvanic isolation to the communication module 9, and an electrical adjustment in terms of an Ethernet connection can be made. In addition, the magnetics 46 of the transformer module 45 are calculated so that Ethernet/Profinet communication with 100 Mbit/s is possible, regardless of whether or not a so-called Ethernet socket is installed with the communication module 9 via an electrical connection 48. It is also irrelevant whether an Ethernet socket 47 contains magnetics on the circuit board to be tested 6 is installed by design or not.

In addition to the above-described components, the test module 4 can also have a thermography system, preferably in the form of an infrared camera 130 or a temperature sensor, preferably a non-contact temperature sensor. However, the variant of the temperature sensor is less preferred because of the smaller detection range of the temperature measurement. The infrared camera, however, allows a temperature measurement of individual components of a circuit board and their connection to circuit board 6 to be tested 6. The temperature measurement of the IR camera can be done by freely positioning the test module 4 with the IR camera 30 along the surface of the circuit board to be tested 6 at certain preferred locations. The temperature measurement can preferably be carried out without contact. As an alternative or in addition to the temperature measurement by the infrared camera, a test tip provided with a temperature sensor can also carry out a temperature measurement by contacting the circuit board. However, this variant requires a higher design and mechanical control effort associated with a more time-consuming measurement compared to the IR camera.

Figure 3:
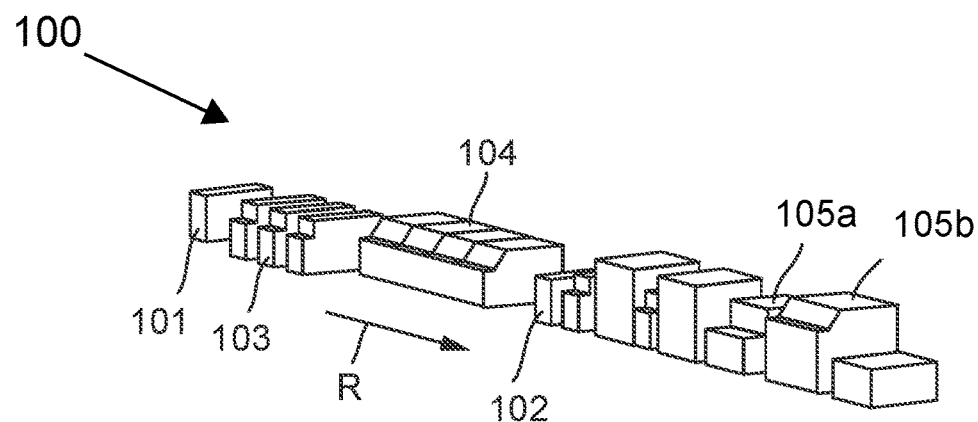
FIG. 3 is a schematic representation of a production line for producing a circuit board with A test system 1 according to the invention integrated in the production line.

FIG. 3 shows a production line 100 for manufacture and test of circuit boards 6 according to the invention, which can be preferably used in measuring devices of automation technology, e.g., in sensors or transducers.

The production line 100 has a station 101 for providing a basic body of the circuit board, also called multiblock. The basic body of the circuit board can already have printed conductor tracks.

The production line 100 has a transport device 102, for example, a conveyor belt, with which the basic body of the circuit board is transported further in the transport direction R from station to station.

Starting from the station 101 in which the provision of the basic body of the circuit board takes place, the latter is transported further to a station 103 for populating the basic body of the circuit board with electronic components, wherein at least one of these components is an intelligent component, which is embodied, for example, as communication module 9 for communication with other electronics devices located away from the circuit board. A further intelligent component is a central processor unit, which is part of the circuit board 6 to be tested and which manages the data of the data memory 10. In this case, the circuit board 6 is formed from the basic body of the circuit board. The populating can occur, e.g., with the assistance of population masks previously applied on the basic body of the circuit board.

Following the station 103 for populating the circuit board, the circuit board 6 is transported into a soldering oven 104. In this unit, the electronic components are soldered to the basic body of the circuit board.

After passing through the soldering oven 104, a final inspection of the finished circuit board 6 by the test system 105a and 105b occurs. In this case, the test system 105a carries out a simultaneous check:
- of the electrical connections of the solder joints between the components and the circuit board and
- a functional test of one or more of the intelligent components, e.g., of the communication module 9.

The aforementioned functional test preferably comprises a functional test of the communication module 9, programming and/or a check of the programming of the data memory 10 of the circuit board 6, and a check of the data line starting from the communication module to the central processor unit of the circuit board 6.

The complex testing of data on the data memory, the processor unit, and the communication module cannot be done by individual test tips because they are introduced from the top of the circuit board. For this purpose, the above-described communication interface 5 is needed, preferably with the above-described configurations of the respective array arrangements 23 or 33, made up of several contact tips 22 or 32.

The invention claimed is:

1. A test system for checking electrical connections between electronic components of a circuit board, comprising:
   a temperature measurement device configured to measure a temperature of the electrical connections and the electronic components and to determine characteristic thermal values of the electrical connections and of the electronic components;
   a housing and
   a communication interface having at least three electrically-conductive contact tips, which, by contacting with a contacting arrangement on the circuit board having several contacting points, enable data exchange with a data memory of the circuit board, wherein the data exchange takes place according to a communication protocol.

2. The test system according to claim 1, wherein the temperature measurement device is movably arranged in at least two spatial directions within the housing of the test system.

3. The test system according to claim 1, wherein the temperature measurement device is configured to perform a non-contact temperature measurement.

4. The test system according to claim 3, wherein the non-contact temperature measurement is carried out by a thermography system, including an infrared camera.

5. The test system according to claim 1, wherein the communication interface and the temperature measurement device are rigidly connected to a test module which is movably arranged in at least two spatial directions arranged in the housing of the test system.

6. The test system according to claim 5, wherein the test module includes a sensor device for detecting an identification feature of the circuit board, including a barcode, a serial number, or a QR code, wherein the test system is configured to use the identification feature to retrieve a record of a permissible temperature profile for that type of board.

7. The test system according to claim 5, wherein the test module includes at least one tool component for repairing electrical connections on or at the circuit board, wherein the tool component is controlled on the basis of measured values determined by means of the temperature measurement device.

8. The test system according to claim 1, further comprising:
   a data memory on which data sets with regard to at least one permissible temperature scale of the electronic components and/or subregions of a circuit board are stored for a comparison with a determined temperature and/or thermal values of the electronic components of the circuit board.

9. The test system according to claim 1, further comprising:
   a current and/or voltage source embodied to supply energy to the temperature measurement device, wherein the current and/or voltage source is rigidly connected to the temperature measurement device and movably arranged in at least two spatial directions within the housing of the test system.

10. A test system for checking electrical connections between electronic components of a circuit board, comprising:
    a temperature measurement device configured to measure a temperature of the electrical connections and the electronic components and to determine characteristic thermal values of the electrical connections and of the electronic components;
    a housing; and
    a test module which is movably arranged in at least two spatial directions arranged in the housing,
    wherein the temperature measurement device is rigidly connected to the test module,
    wherein the test module includes a sensor device for detecting an identification feature of the circuit board, including a barcode, a serial number, or a QR code, wherein the test system is configured to use the identification feature to retrieve a record of a permissible temperature profile for that type of board.

11. A test system for checking electrical connections between electronic components of a circuit board, comprising:
    a temperature measurement device configured to measure a temperature of the electrical connections and the electronic components and to determine characteristic thermal values of the electrical connections and of the electronic components;
    a housing; and
    a test module which is movably arranged in at least two spatial directions arranged in the housing,
    wherein the temperature measurement device is rigidly connected to the test module, and wherein the test module includes at least one tool component for repairing electrical connections on or at the circuit board, wherein the tool component is controlled on the basis of measured values determined by means of the temperature measurement device.

12. A test system for checking electrical connections between electronic components of a circuit board, comprising:
- a temperature measurement device configured to measure a temperature of the electrical connections and the electronic components and to determine characteristic thermal values of the electrical connections and of the electronic components;
- a housing;
- a test module which is movably arranged in at least two spatial directions and toward an underside of the circuit board arranged in the housing;
- a communication interface; and
- at least one pin-shaped test tip, wherein the at least one test tip is configured to be freely movable above the circuit board to be tested, wherein the at least one test tip is arranged to be guided from above for testing an electrical integration of electronic components on the circuit board by determining resistance values of contact points on the circuit board,
- wherein the communication interface and the temperature measurement device are rigidly connected to the test module.

* * * * *